(12) United States Patent
Johnson

(10) Patent No.: US 9,754,997 B2
(45) Date of Patent: Sep. 5, 2017

(54) MAGNETIC TUNNEL JUNCTION BASED RECONFIGURABLE PROCESSING SYSTEM AND COMPONENTS

(71) Applicant: Mark B. Johnson, Potomac, MD (US)

(72) Inventor: Mark B. Johnson, Potomac, MD (US)

( * ) Notice: Subject to any disclaimer, the term of this patent is extended or adjusted under 35 U.S.C. 154(b) by 0 days.

(21) Appl. No.: 15/290,200

(22) Filed: Oct. 11, 2016

(65) Prior Publication Data

US 2017/0154924 A1 Jun. 1, 2017

Related U.S. Application Data

(63) Continuation-in-part of application No. 15/250,779, filed on Aug. 29, 2016, and a continuation-in-part of application No. 15/250,784, filed on Aug. 29, 2016, said application No. 15/250,779 is a continuation-in-part of application No. 15/219,928, filed on Jul. 26, 2016, said application No. 15/250,784 is a continuation-in-part of application No. 15/219,928, filed on Jul. 26, 2016, which is a continuation-in-part of application No. 14/703,006, filed on May 4, 2015, now Pat. No. 9,432,021, which is a continuation of application No. 14/133,055, filed on Dec. 18, 2013, now Pat. No. 9,024,656.

(60) Provisional application No. 61/739,757, filed on Dec. 20, 2012.

(51) Int. Cl.

| G11C 11/18 | (2006.01) |
|---|---|
| H01L 27/22 | (2006.01) |
| H01L 43/02 | (2006.01) |
| H01L 43/08 | (2006.01) |
| G11C 11/16 | (2006.01) |

(52) U.S. Cl.
CPC .......... H01L 27/228 (2013.01); G11C 11/161 (2013.01); G11C 11/1675 (2013.01); H01L 43/02 (2013.01); H01L 43/08 (2013.01)

(58) Field of Classification Search
CPC ....... H01L 27/20; H01L 27/22; H01L 27/222; H01L 27/226; H01L 27/228; G11C 11/02; G11C 11/16; G11C 11/161; G11C 11/18
See application file for complete search history.

(56) References Cited

U.S. PATENT DOCUMENTS

| 5,629,549 A | 5/1997 | Johnson |
| 5,652,445 A | 7/1997 | Johnson |
| 6,140,838 A | 10/2000 | Johnson |
| 7,379,321 B2 | 5/2008 | Ravelosona et al. |
| 7,394,247 B1 * | 7/2008 | Guo ........................ B82Y 25/00 324/207.21 |
| 7,397,285 B2 | 7/2008 | Agan et al. |
| 8,198,919 B1 * | 6/2012 | Kozhanov ........... H01F 10/3254 326/104 |

(Continued)

OTHER PUBLICATIONS

Behin-Aein, B. et al., "Proposal for an All-Spin Logic Device with Built-in Memory," Nature Nanotech 5, 266 (2010).

(Continued)

*Primary Examiner* — Jason M Crawford
(74) *Attorney, Agent, or Firm* — J. Nicholas Gross

(57) ABSTRACT

Resistance elements, including Magnetic Tunnel Junction devices are configured as magnetoelectronic (ME) devices. These resistive devices are useable as circuit building blocks in reconfigurable processing systems, including as logic circuits, non-volatile switches and memory cells.

11 Claims, 14 Drawing Sheets

(56) References Cited

U.S. PATENT DOCUMENTS

| | | | |
|---|---|---|---|
| 9,024,656 B2 | 5/2015 | Johnson | |
| 9,331,266 B2 | 5/2016 | Chang et al. | |
| 9,432,021 B2 | 8/2016 | Johnson | |
| 2008/0272771 A1* | 11/2008 | Guo | B82Y 25/00 324/260 |
| 2009/0102464 A1* | 4/2009 | Doogue | B82Y 25/00 324/207.21 |
| 2010/0091563 A1* | 4/2010 | Zheng | B82Y 25/00 365/171 |
| 2010/0213933 A1* | 8/2010 | Mather | G01R 33/098 324/252 |
| 2012/0193736 A1* | 8/2012 | Mather | G01R 33/098 257/421 |
| 2012/0300543 A1* | 11/2012 | Ohno | H01F 10/3254 365/171 |
| 2013/0141091 A1* | 6/2013 | Delaet | G01R 33/093 324/252 |
| 2014/0010004 A1* | 1/2014 | Suzuki | H01L 27/228 365/158 |
| 2014/0056060 A1 | 2/2014 | Khvalkovskiy et al. | |
| 2014/0167814 A1 | 6/2014 | Chang et al. | |
| 2014/0169088 A1 | 6/2014 | Buhrman et al. | |
| 2014/0176184 A1 | 6/2014 | Johnson | |

OTHER PUBLICATIONS

Johnson, Mark et al., "Magnetoelectronic Latching Boolean Gate," Solid State Electronics 44, 1099 (2000), 6 pages.

Johnson, Mark, "Magnetic Logic: Fundamentals, Devices, and Applications," Wiley Encyclopedia of Electrical and Electronics Engineering, ed. John Webster; John Wiley and Sons, Inc. Hoboken, NJ, 2015.

Joo, S. et al., "Magnetic field controlled reconfigurable semiconductor logic," published online in Nature, approximately Jan. 30, 2013, 15 pages.

Ney, A. et al., "Programmable Computing with a Single Magnetoresistive Element," Nature 425, 485 (2003), 3 pages.

Salahuddin, S., "A new spin on spintronics," published online in Nature, Feb. 7, 2013, 2 pages.

Xu, P. et al., "An All-Metal Logic Gate Based on Current-Driven Domain Wall Motion," Nature Nanotech 3, 97 (2008), 4 pages.

* cited by examiner

|     | NAND | NOR | AND | OR  | XOR |
| --- | ---  | --- | --- | --- | --- |
| C1  | 0    | 1   | NA  | NA  | 0   |
| C2  | NA   | NA  | 0   | 1   | 1   |
| RB1 | 1    | 1   | 0   | 0   | 1   |
| RB2 | 0    | 0   | 1   | 1   | 1   |

Inverted Output

FIG. 5B

|     | AND | OR  | NAND | NOR | XNOR |
| --- | --- | --- | ---  | --- | ---  |
| C1  | 0   | 1   | NA   | NA  | 0    |
| C2  | NA  | NA  | 0    | 1   | 1    |
| RB1 | 1   | 1   | 0    | 0   | 1    |
| RB2 | 0   | 0   | 1    | 1   | 1    |

Noninverted Output

FIG. 5C

MAGNETIC TUNNEL JUNCTION BASED RECONFIGURABLE PROCESSING SYSTEM AND COMPONENTS

RELATED APPLICATION DATA

The present application claims priority to and is a continuation-in-part of Ser. No. 15/250,779, filed Jul. 26, 2016, and Ser. No. 15/250,784 filed Jul. 26, 2016, which applications are continuations-in-part of Ser. No. 15/219,928 filed Jul. 26, 2016, which is a continuation-in-part of Ser. No. 14/703,006 filed May 4, 2015, now U.S. Pat. No. 9,432,021, which is a continuation of Ser. No. 14/133,055 filed Dec. 18, 2013, now U.S. Pat. No. 9,024,656, and which in turn claims the benefit under 35 U.S.C. §119(e) of the priority date of Provisional Application Ser. No. 61/739,757 filed Dec. 20, 2012, all of which are hereby incorporated by reference. The present application is also related to Ser. No. 15/290,186 filed on the present date, attorney docket number MJ 2016-1CIP3 and which is also incorporated by reference herein.

STATEMENT AS TO GOVERNMENT RIGHTS

This application is a continuation in part and claims priority to an application that was filed during a time when the inventor was employed by the Naval Research Laboratory as part of Task Area MA02-01-46, Work Unit T042-97, and was developed as a result of efforts associated with NRF grants funded by MEST (2010-0000506, 2011-0012386 and 2012-0005631), the industrial strategic technology development program funded by MKE (KI002182), the Dream project, MEST (2012K001280), GRL and the Office of Naval Research. To the extent they are not otherwise alienated, disclaimed or waived, the government may have certain limited rights to use, practice or otherwise exploit some or all portions of the inventions herein.

FIELD OF THE INVENTION

The present invention relates to non-volatile logic and memory elements/circuits, and particularly composite circuits using both magnetoelectronic and semiconductor devices. The invention has particular relevance to methods and circuits that perform information processing with very low power consumption.

BACKGROUND

The following references are useful as starting points for understanding the field of magnetoelectronic logic circuits:
Mark Johnson, U.S. Pat. No. 6,140,838, "High Density and High Speed Magneto-electronic Logic Family" (October 2000).
Mark Johnson, B. R. Bennett, P. R. Hammar and M. M. Miller, "Magnetoelectronic Latching Boolean Gate," Solid-State Electronics 44, 1099 (2000).
H. Meng, J. Wang and J. -P. Wang, "A spintronics full adder for magnetic CPU," IEEE Electron. Device Lett., vol. 26 (6), pp. 360-362, (2005).
Tae-wan Kim et al., U.S. Pat. No. 7,439,770 B2, "Magnetic Tunneling Junction Based Logic Circuits and Methods of Operating Same," (January 2008).
Mark Johnson, "Magnetic Logic: Fundamentals, Devices, and Applications," Wiley Encyclopedia of Electrical and Electronics Engineering, ed. John Webster, (John Wiley and Sons, Inc., Hoboken, N.J., 2015).
Neal Berger and Mourad El Baraji, U.S. Pat. No. 8,218,349 B2, "Non-volatile Logic Devices Using Magnetic Tunnel Junctions," (July 2012).
Lew G. Chua-Eoan et al., U.S. Pat. No. 8,295,082 B2, "Gate level reconfigurable magnetic logic" (October 2012).
Mark Johnson, U.S. Pat. No. 9,024,656,"Nonvolatile Logic Circuit Architecture and Method of Operation," (May, 2015).

The present application involves magnetoelectronic cells used for Boolean logic and Memory applications. The use of magnetoelectronic devices for memory and Boolean logic applications has been described in the art for more than two decades. Early applications for nonvolatile integrated memory used anisotropic magnetoresistive devices in a block-addressable random access memory (RAM) architecture. U.S. Pat. No. 5,565,695 ("Magnetic spin transistor hybrid circuit element," 1996), by the inventor described a memory cell composed of a magnetoelectronic device (spin transistor) and a field effect transistor (FET) used to isolate the cell from a two dimensional array of cells. This cell was then used in a bit-addressable magnetic RAM (MRAM) architecture. U.S. Pat. No. 5,629,549 ("Magnetic spin transistor device, logic gate & method of operation," 1997), by the inventor, described the use of a magnetoelectronic device (spin transistor) for simple Boolean logic operations such as AND, OR, NAND and NOR. A similar description was published by the inventor as "The all-metal spin transistor," I.E.E.E. Spectrum Magazine 31 (5), 47 (1994).

U.S. Pat. No. 6,140,838 ("High density and high speed magneto-electronic logic family," 2000), by the inventor, described the response of the magnetization orientation of a patterned ferromagnetic element to magnetic field pulses as the result of Boolean logic operations. The ferromagnetic film therefore performed as a Boolean logic gate. The field pulses were associated with pulses of current applied to inductively coupled input wires. A ferromagnetic element having 3 input terminals was described. Terminals A and B were used for binary data input. A pulse applied to terminal C would control the function of the gate. For control pulses of logical 0 or 1, the gate could be configured to perform a Boolean AND or OR operation. An alternative operation performed NAND or NOR operations. The ferromagnetic film was incorporated as part of a magnetoelectronic device. Readout of the result of the operation involved activating the magnetoelectronic device. These ideas were published as "Magnetoelectronic Latching Boolean Gate," Solid-State Electronics 44, 1099 (2000), where the ferromagnetic film was incorporated as part of a Hybrid Hall Effect (HHE) device. Implementation of the HHE device for this kind of reconfigurable logic was described in patent '838. This patent generalized the reconfigurable logic idea to the case where the ferromagnetic film is incorporated in a generic magnetoelectronic device.

The article "A spintronics full adder for magnetic CPU" (IEEE Electron. Device Lett., vol. 26 (6), pp. 360-362, 2005) by H. Meng, J. Wang and J. -P. Wang, describes the same Boolean operations described in '838 for the case where a ferromagnetic film with three inputs is incorporated in a magnetic tunnel junction (MTJ). The MTJ has three input terminals, A, B and C. Instead of providing inputs in the form of a locally applied magnetic field, the inputs to the MTJ use spin polarized current pulses in the spin torque transfer (STT) technique. The inputs are analogous and the spin polarized current pulses can be thought of as providing an effective magnetic field that operates on the magnetization orientation. In U.S. Pat. No. 7,439,770 B2 (2008), inventors Tae-wan Kim et al. describe the same cell and reconfigurable process presented in the article by Meng et al.

In "Magnetic Logic: Fundamentals, Devices, and Applications," Wiley Encyclopedia of Electrical and Electronics Engineering, ed. John Webster, (John Wiley and Sons, Inc., Hoboken, N.J., 2015), the inventor describes a variation of the STT input mechanism in which the STT current is driven from a ferromagnetic source layer to a ferromagnetic free layer, and the free layer is incorporated in a magnetoelectronic device such as an MTJ. The resulting device has three STT inputs and performs as a reconfigurable Boolean logic gate.

Patent '838 also disclosed the invention of a simple composite cell composed of a magnetoelectronic device and a simple CMOS buffer amplifier. The specific case where the magnetoelectronic device is a HHE device was used. Digital logic processing typically involves multiple steps during which the output of one gate is used as the input to one or more subsequent gates. The composite cell has the advantage that it has CMOS output levels (for both LOW and HIGH) and fanout to subsequent logic gates (cells) in a chain of cells is readily achieved. The composite cell also can be used as nonvolatile memory for occasions when one or several data values must be stored, but a full 2-dimensional RAM array is not needed.

In U.S. Pat. No. 8,295,082 B2 (2012), Chua-Eoan et al. describe a reconfigurable composite logic cell. The basic cell is composed of 4 MTJs and 2 CMOS sensor circuits. The cell can be configured to perform the four basic Boolean operations, AND, OR, NAND and NOR. In the first step, each MTJ is individually "preset" by an input value of binary 0 or 1. In the second step, each MTJ receives one of four inputs: A, bar A, B and bar B. These inputs determine the output states of the 4 MTJs and the results are stored in a nonvolatile way. To read out a result, the output voltages of the MTJs are summed and transmitted to a first CMOS sensor circuit. This sensor circuit can be configured (by separate selection method) to have one of several different values of threshold voltage. The sensor circuit receives a selected threshold voltage and then gives output of a first logical signal that corresponds to the selection of one of two Boolean operations, e.g. AND or OR. The cell includes a second CMOS circuit that follows the first sensor circuit and is configured as a NOT gate (inverter). The result of a Boolean NAND or NOR operation is available at the output of the second CMOS circuit.

In U.S. Pat. No. 8,218,349 B2 (2012), Berger et al. present a register cell, described as an unbalanced flip-flop, composed of 2 MTJs integrated as circuit components inside the circuits of two CMOS inverters. The inventors then describe a shift register composed of a plurality of the register cells.

The incorporation of magnetoelectronic devices into more diverse domains is expected to increase in the near future. These devices offer a number of benefits, particularly in low power applications. For example, U.S. Pat. No. 9,024,656 by the present inventor (incorporated by reference herein) describes a system and method for performing low power logic operations. Whereas logic operation performed with traditional semiconductor technology relies on periodic synchronized pulses from a clock, operation of the low power technique uses individual pulses. In the former case, the logic system is constantly powered on. In the latter case, the quiescent state of the system is off. Power is applied only during the brief intervals when individual pulses are required. At all other times, the system draws no power. In '656, this novel kind of digital logic processing is called nonvolatile logic.

The invention described in '656 was motivated by the development of a novel device, the magnetic field controlled avalanche diode (MFCAD). The MFCAD is described in the article (Nature, 2013) and in U.S. Pat. No. 9,331,266 B2 (Joonyeon Chang, Mark Johnson et al., "Magnetic Field Controlled Reconfigurable Semiconductor Logic Device and Method for Controlling Same"). This device can behave as a nonvolatile reconfigurable Boolean logic cell. Patent '656 showed how the reconfigurable cell could be used for constructing logic building blocks, including as an Arithmetic Logic Unit (ALU) that performs binary logic operations. The patent then developed and presented an architecture for a nonvolatile digital logic and signal processing system. Dramatic power savings can be achieved because the normal operational state is "off." When an operation is required, individual pulses are applied and, when the operation is complete, the results are stored in nonvolatile memory and the system returns to the quiescent, zero power condition.

The magnetic field controlled avalanche diode is a type of magnetoelectronic device where the output is an electric current. Most magnetoelectronic devices, for example the spin valve (SV) and the magnetic tunnel junction (MTJ), are magnetoresistors. They behave as variable resistors with bistable LOW and HIGH resistance values that are associated with binary 0 and 1, and thus can be considered as resistance-based elements. The resistance state is a function of the magnetization orientation of one (the free ferromagnetic layer) of two ferromagnetic layers in the SV or MTJ. The resistance state can be set (i.e. written) using a magnetic field to set a magnetization orientation state. For integrated devices, the magnetic field is associated with an electric write current. The write current may be applied through an inductively coupled write wire and produces a local magnetic field. Alternatively, the write current may be a spin polarized current injected directly into the ferromagnetic layer. The resistance state of the magnetoresistor then is sensed (i.e. read out) by applying a bias and measuring the resistance. The resistance state of the SV and MTJ is detected by electric transport properties associated with a spin polarized current that transits both ferromagnetic layers. Because magnetoresistors typically have a large resistance value, the bias is commonly a current and the output is read out is a voltage.

Thus, a typical magnetoelectronic device has current input and voltage output. These characteristics are ideal for nonvolatile memory but are problematic for logic. Digital logical processing requires multiple operations performed by different linked stages. One gate is linked to subsequent gates by fanout, with the output of one gate providing the input to one or more subsequent gates. Fanout requires that device output preferably should be a reliable and reproducible current source.

In the MFCAD, the channel of an avalanche diode has resistance values that depend on the orientation of an applied magnetic field. The diode typically is biased by a voltage and the output is a current that depends on the magnetic field. The MFCAD differs from the SV and MTJ in that detecting the output does not involve spin polarized current flowing in the channel of the device. For the integrated MFCAD, the external magnetic field is provided as a local fringe magnetic field near the ends of one or more patterned ferromagnetic elements. The magnetization states of the ferromagnetic elements, and therefore the locally applied fields, are bistable and nonvolatile.

Thus, the MFCAD is characterized as a device with bistable magnetization configurations that are set by applying an input write current (preferably an STT process) to patterned ferromagnetic elements in the MFCAD device cell. For read out, the diode channel is biased with a voltage to give an output in the form of a current, with bistable output current values that depend on the locally applied magnetic field, and therefore depend on the magnetization configuration of the ferromagnetic elements. As such, it is well suited for use in circuits with other MFCADs, or with other magnetoelectronic devices, where the input is required to be a current. A disadvantage of the MFCAD is that while it is a promising device, to date it is in an early stage of research and development and has not been commercialized.

The MFCAD has demonstrated basic reconfigurable functions. As described in (Nature, 2013) and '266, one embodiment of a single MFCAD reconfigurable cell can be reconfigured to perform an AND or OR function. A different embodiment can be reconfigured to perform a NAND or NOR function. The architecture described in '656 is general and works for an ALU that can be reconfigured to perform more than two Boolean functions. However, the example presented in '656 involved an ALU that could be reconfigured to perform two functions, the AND or OR function.

SUMMARY OF THE INVENTION

An object of the present invention, therefore, is to overcome the aforementioned limitations of the prior art. It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions.

An object of the present disclosure therefore is to overcome some of the limitations of existing MFCAD structures by developing ALUs that involve other magnetoelectronic devices, specifically a suitable magnetic tunnel junction (MTJ) device. A further objective is to develop ALUs comprising composite sub-circuits that include a magnetoelectronic device along with one or several semiconductor transistors.

Another object of the present invention is to provide an improved MTJ device cell that can operate as the ALU that is used in the nonvolatile logic architecture of '656. Equivalently stated, this shows that the nonvolatile architecture of '656 can be implemented using an appropriate MTJ cell.

Another object of the invention is to provide a composite MTJ cell that has CMOS level outputs, which thereby offers further significant improvement.

A further object of the invention is to show that simple combinations of the composite MTJ device cells can operate as the ALU and perform reconfigurable functions of AND, OR, NAND, and NOR. Therefore the improved composite MTJ cell expands the utility of the ALU and thereby offers significant advantages.

A further object of the invention is to show how a resistance based magnetoelectronic device, the MTJ, can be used in combination with one or more CMOS FETs to form a cell that behaves as an appropriate nonvolatile switch.

Still a further object of the invention is to show how a resistance based magnetoelectronic device, the MTJ, can be used with a small number of CMOS FETs to form a memory cell. The sub-circuit for this cell is nearly identical with the nonvolatile reconfigurable Boolean logic cell that is used as the ALU.

Furthermore, a final object of the invention is to show that this NV resistive memory cell can be used with CMOS logic sub-circuits and circuits. When used at the output stage, this NV memory cell can store the results of an operation. The sub-circuit or circuit then can be powered down until the result is needed at a later time. The result then can be recalled in the form of a CMOS compatible binary pulse.

DESCRIPTION OF THE DRAWINGS

FIG. 5B provides a truth table for the logic unit of FIG. 5A.

FIG. 5C provides a truth table for a logic unit similar to FIG. 5A but having a noninverting buffer amplifier.

FIG. 7 shows a preferred embodiment of a reconfigurable composite logic cell composed of a single MTJ cell and a CMOS buffer amplifier. The cell can perform the functions NAND/NOR; a cell with noninverting CMOS buffer amplifier would perform the functions AND/OR.

DETAILED DESCRIPTION OF THE INVENTION

The devices, circuits and logic units described herein have important advantages. Several embodiments are reconfigurable to perform multiple Boolean operations, such as AND, OR, NAND, NOR, XOR. All embodiments preferably have output levels where HIGH is a positive voltage, and LOW is substantially equal to zero (the maximum deviation from zero is preferably about a few percent of the HIGH level). The HIGH output voltage typically is high enough to provide output as a current. Such levels are readily sensed and then associated with a logical binary "0" and logical "1." This is an advantage over the MFCAD device where a LOW output is not exactly equal to a possible zero level. In fact the LOW level is approximately 10-20% of the HIGH level. Furthermore, this is an advantage over prior art magnetoresistive devices where a LOW output also is not exactly zero, and in fact can be as much as 50% of a HIGH level.

Furthermore, several embodiments disclosed herein provide output voltages at calibrated semiconductor CMOS levels $V_{DD}$ and $V_{SS}$. Such levels are appropriate for integration with traditional semiconductor digital electronic (SDE) devices. Furthermore, these levels can be easily converted in turn to current pulses with amplitudes that are sufficient to provide output from one stage to input at one or more subsequent reconfigurable magnetoelectronic cells/circuit stages.

The preferred embodiment discussed below is a form of resistive device, namely, an MTJ device in a cell with several simple circuit elements. Whereas an MTJ has output levels of R (LOW) and R+DR (HIGH), the improved magnetoelectronic cell has output levels of LOW~0 and HIGH~DR representing different resistive states. This resistance based cell can be configured for many purposes, including to operate as the ALU that is used in the nonvolatile logic architecture of '656 and perform reconfigurable functions of AND, OR, NAND, NOR.

In addition, patent '656 employs several "nonvolatile pass switches" (NV pass switch). For example, such a switch is used to open or close access to a data bus or address bus. The resistive devices described here, in combination with one or more CMOS FETs, can form a cell that behaves as an appropriate nonvolatile switch.

The '656 patent also employs several nonvolatile memory cells (NV memory). For example, such a cell is used as a test register at the output stage of the ALU, and such cells are used as registers at the data input ports. The resististance based devices described herein can be implemented as such form of memory cell.

Figure 1:
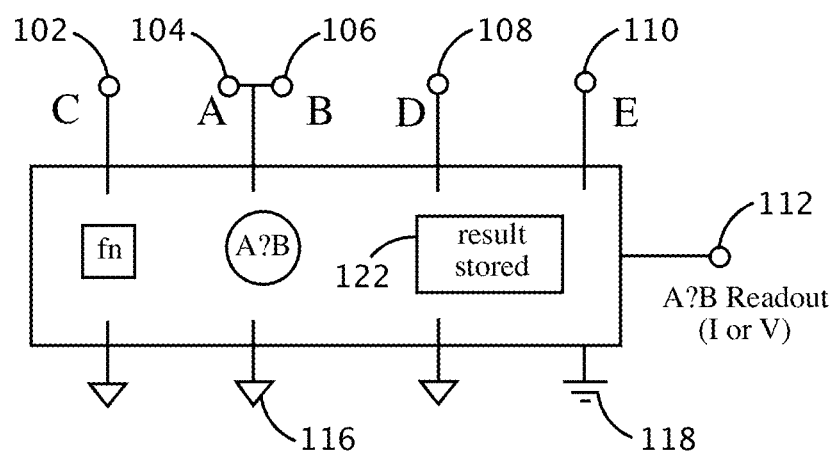
FIG. 1 is a schematic diagram of a preferred embodiment of a reconfigurable non-volatile logic unit implemented in accordance with the teachings of the '656 patent.

FIG. 1 presents a symbolic description of a generic ALU 100 that is central to the architecture of '656. The operation of this device is summarized here to better understand the context of the innovations of the present disclosure.

As described above, the ALU in '656 was based on a preferred embodiment in which an MFCAD is used as the reconfigurable logic element. A pulse applied to terminal C 102 configures or determines the Boolean function (AND or OR; NAND or NOR). At a later time, input pulses applied to terminals A 104 and B 106 (pulses to A and B are synchronous, but the pulse to C occurs at any prior time) result in a configuration of the magnetization orientation of ferromagnetic elements that provide local fields to the avalanche diode. These fields set/determine the output current of the diode. At any later time, a readout voltage pulse applied to terminal D 108 results in a current through the diode. The current has stable LOW (binary 0) or HIGH (binary 1) values representing the result of the selected Boolean operation on input A, B.

In FIG. 1, the "result stored" box 122 has the following meaning. Once inputs C, A and B are applied, the reconfigurable device in the ALU is in a nonvolatile configuration (retains a logic state) that represents the result of the process A?B. Applying a read bias to terminal D 108 reads out the result by sensing the state of the ME device. Patent '656 also states that a separate nonvolatile memory element (for example, an MTJ) may be incorporated in cell 100. The first time 108 is activated to read a result, that result also is preferably stored in the separate ME memory device 122. In the preferred embodiment envisioned in '656, the reconfigurable device is the MFCAD, which normally gives output as an electric current. A (current or voltage) bias pulse applied to terminal E 110 at any time will provide voltage readout at output 112 as an alternative to current readout. As discussed in '656, the separate nonvolatile memory element 122 may use a ground 118 that differs from the ground 116 used by the reconfigurable logic device. For purposes of simplifying and understanding the more important aspects of the present invention, less essential features of the device (such as the grounds for the input are readout functions) are omitted from further discussion herein.

The following paragraphs explain how new forms of MTJ device (and other resistance based) cells can be used to form a reconfigurable Boolean logic cell that is operationally identical, in all necessary aspects, with the cell formed using the MFCAD. Each of these cells therefore can be used or substituted for such MFCADs in the architecture developed in '656 as desired for any particular application. The cells also can be used as the Nonvolatile Memory cells and Nonvolatile Pass switches in the architecture of '656.

It can be noted that the physical principles of operation of an MTJ are somewhat different from those of the MFCAD. In the MTJ, the LOW and HIGH resistance levels are determined by the tunneling conductance of a spin polarized current. As noted in the description of the MFCAD in FIG. 1, the magnetization of ferromagnetic elements proximal to the diode channel provides local magnetic fields that control the conductance of the avalanche diode. The output levels, which are functions of the conductance, are therefore controlled by local magnetic fields and spin polarized current is not involved. In both the MTJ and MFCAD however, the magnetization orientations of ferromagnetic layers and elements are written by spin polarized input currents using an STT process.

MTJ devices are now becoming more widespread in different applications, and therefore offer a platform for advancing new forms of ME devices into new applications. The present disclosure therefore describes cells that can be used as building blocks in nonvolatile logic circuits, such as the architecture described in '656. Because the industry is becoming more familar with MTJs, the preferred magnetoelectronic device in the resistance based cell is a new form of magnetic tunnel junction.

Figure 2A:
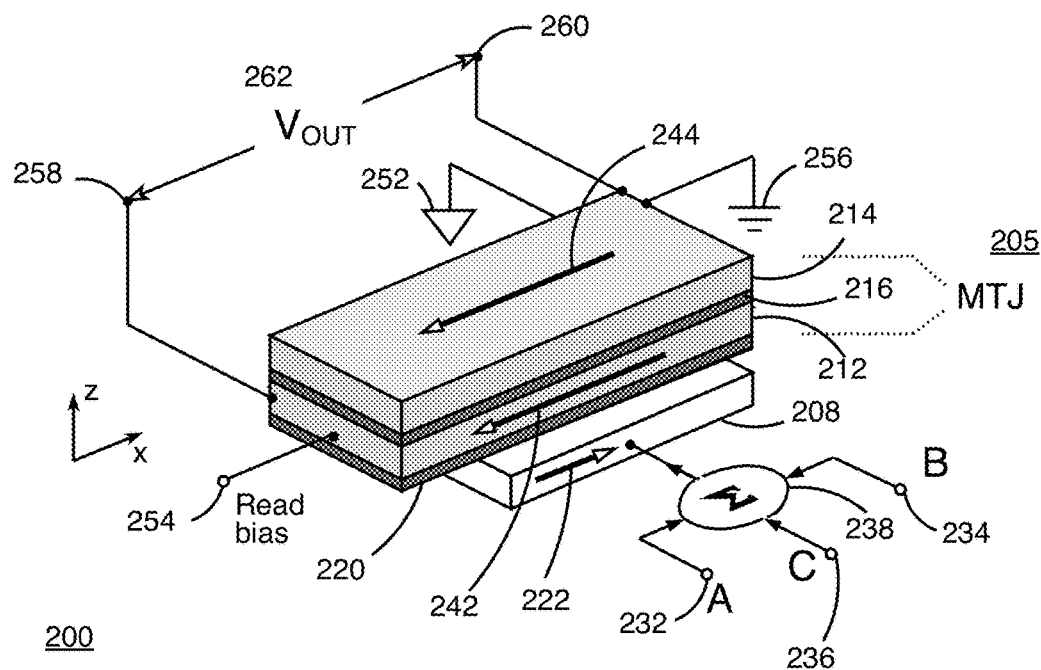
FIG. 2A is a perspective sketch of a preferred embodiment of a magnetic tunnel junction (MTJ) with 3 input terminals adapted for a Spin Torque Transfer (STT) process of writing the free layer.

A preferred embodiment of an MTJ with STT inputs is shown in FIG. 2A. Two thin ferromagnetic films 212, 214 (typically an alloy of the form FeBCo) are separated by a low transmission tunnel barrier 216 (typically MgO). Both F films 212, 214 have bistable magnetization orientation states and parallel uniaxial magnetization axes. The magnetization orientation 244 of a first F film 214 (the top film in FIG. 2A) is preferably pinned and is typically labeled $F_p$. The pinned orientation 244 preferably is set to lie in a chosen direction (to the left in the example in the figure).

The magnetization orientation 242 of the other film 212, typically labeled $F_f$, is freely adjustable to have one of two orientations. By altering orientation 242, the resistance R of the MTJ can be varied so that it is low ($R=R_L$) when the magnetization orientations (242, 244) are parallel and high ($R=R_H$) when antiparallel. The difference between low and high values is $R_H-R_L=DR$. The magnetoresistance ratio, also called the magnetoresistance (MR) is defined as $MR=DR/R_L$.

In FIG. 2A, the MTJ 205 is composed of the free layer $F_f$ 212, the pinned ferromagnetic layer $F_p$ 214, and the tunnel barrier 216. Additional layers to provide STT input including a ferromagnetic pinned source layer 208, and a barrier layer 220. Pinned source layer $F_{w,p}$ 208, with fixed orientation 222, is fabricated below $F_f$. It will be understood by those skilled in the art that this orientation can be reversed without impacting the performance of the device.

To operate the device, a first Reset pulse initializes the orientation 242 to be in a chosen direction, e.g. to the left. Three current pulses are then simultaneously applied to inputs A 232, B 234 and C 236. The pulses are summed and transmitted through the pinned source layer, across the barrier, and through the free layer to a ground 252 connected to free layer $F_f$. As is known in the art, if sufficient spin polarized current is driven through $F_f$, the orientation 242 will change to align with orientation 222. In this way the magnetization orientation 242 of $F_f$ is determined as the result of a Boolean operation on the 3 input current pulses as described in prior art articles (Johnson, Wiley 2015) and prior art patents such as '838.

For simplicity, the amplitudes of each of the three current pulses, $I_{w,A}$, $I_{w,B}$ and $I_{w,C}$, preferably are equal. However, there may be operation modes where the amplitudes differ. The reset pulse required at the beginning of any operation can be a single pulse of the appropriate polarity and amplitude and may be applied to A, B or C.

Summing the input currents, represented by node S 238, may be done using separate wires or may be done with more complex techniques apparent to those skilled in the art in accordance with the goals of the present disclosure. Because a completed switch (reversal of the orientation 242) depends in part on the duration of a pulse, one time-based write technique can use pulses that arrive sequentially (or with some overlap) with a combined duration of the sequence of pulses chosen to be adequate for a complete switch. A current pulse of desired magnitude can be delivered by known techniques in the art, including choosing appropriate impedance for the write wire layers, and in most such cases currents applied to multiple terminals on a single write line will sum because impedances merely add in parallel. Other cases will be apparent to skilled artisans and may require or use a different approach than proposed here, but the precise implementation of such schemes is not critical and is believed to be application specific.

The choice of Boolean operation (for example AND or OR) is determined by control pulse C. The result of the operation is stored in a nonvolatile way as the final orientation 242. At any later time, the result can be read out by applying a bias (voltage or current) from Read bias 254 to Readout ground 256 and measuring a voltage 262 between terminals 258 and 260. Voltage readout is common but those skilled in the art recognize that readout by sensing a current also is possible. The resistance measured between 254 and 256 is low when orientations 242 and 244 are parallel and high when orientations 242 and 244 are antiparallel. Thus, the bistable output states are $LOW=R_L$ and $HIGH=R_L+DR$. Equivalently the output states are $LOW=V_L$ and $HIGH=V_L+DV$, where $V=IR$ and I is the imposed bias current. These levels are not optimal for assigning binary values 0 and 1. It is more convenient to identify level LOW~0 with binary 0 and level HIGH~DV with binary 1.

Figure 2B:
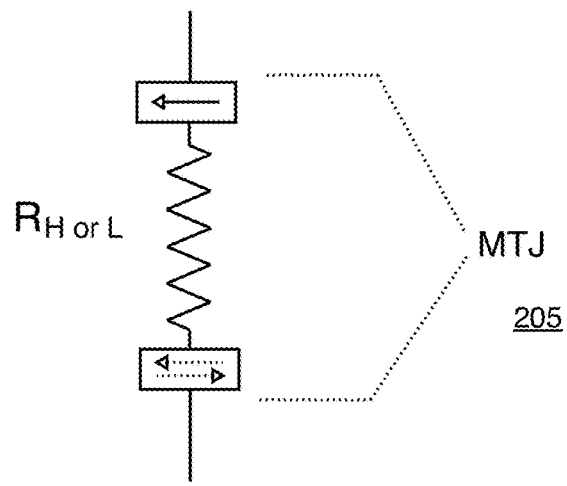
FIG. 2B is a schematic depiction of a circuit symbol representing the MTJ as a resistor with bistable resistance values.

FIG. 2B presents a schematic symbol to represent an MTJ 205 as a variable resistor with stable high and low values. The arrows represent a magnetization orientation of the respective layers. The solid arrow represents the pinned orientation 244 of layer $F_p$ 214 and the dotted arrows represent the variable (bistable) orientations 242 of the free layer $F_f$ 212.

For devices with competitively small transverse dimensions, values of $R_L$ are a few thousand Ohms, and values of MR are 50% to 200%. Research and development of magnetic tunnel junctions have resulted in very reliable devices with highly reproducible characteristics, fabricated on silicon and compatible with CMOS processing. The embodiment in FIG. 2A shows a MTJ for which both F layers have in-plane magnetization orientation. A new generation of MTJs, presently under development, operates in the same way but the F layers have magnetization orientations that are perpendicular to the substrate plane. It will be understood that the teachings of the present disclosure may be applied to such types of MTJs as well.

The MTJ is a resistance based element with many excellent device characteristics making it suitable for ME reconfiguration circuits. Related to the high MR values are values of output voltage 262, DV, that can be a few hundred mV. An objective of this disclosure is to describe a magnetoelectronic reconfigurable logic cell that can be used as the ALU in '656. In the above referenced application Ser. Nos. 15/250,779, 15/250,784, the inventor showed that a Hybrid Hall Effect (HHE) device described by the circuit symbol 300 in FIG. 3A had all the necessary requirements of the ALU. The binary value stored in the device is associated with the magnetization orientation 304 of a free ferromagnetic film 302.

Figure 3A:
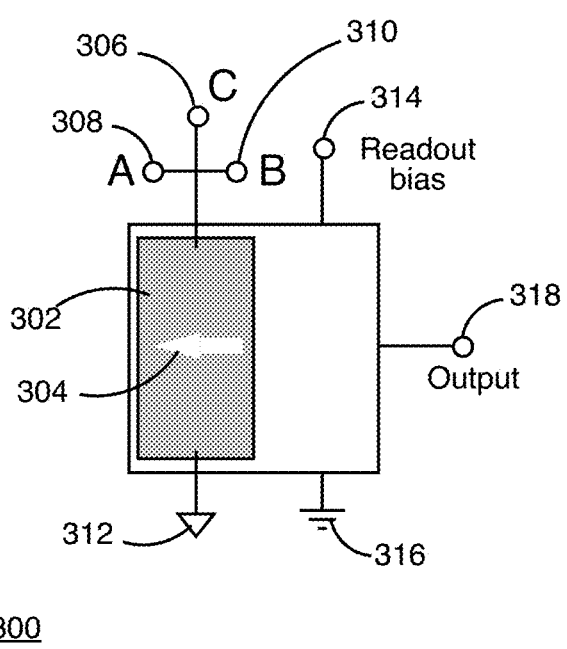
FIG. 3A is a schematic depiction of a circuit symbol that represents a prior art HHE device (from '838) which can be adapted with properties and characteristics suitable for use as an ALU in the '656 logic unit embodiments.

In the embodiment of FIG. 3A, to operate the cell the initial state is set to have orientation to the left (LOW output). Simultaneous STT current pulse inputs are applied to terminals A 308 B 310 and C 306. The current is summed and flows through film 302 to ground 312. The value of the summed current depends on a Boolean operation on the values of the control pulse and the two input datum values. For sufficient current magnitude, the orientation 304 reverses.

In FIG. 3A, device 300 is configured by pulse C to perform either a Boolean AND or OR operation. The result of the operation is stored in a nonvolatile way in the form of the magnetization orientation 304, either left (LOW) or right (HIGH). At any later time, the result can be read out by applying a Readout bias pulse (typically a current) from terminal 314 to ground 316. The output values at terminal 318 are LOW~0 V (binary 0) and $HIGH=2DV_H$, where $DV_H$~10 to 100 mV is the Hall voltage generated by the fringe magnetic field at the end of ferromagnetic film 302.

Figure 3B:
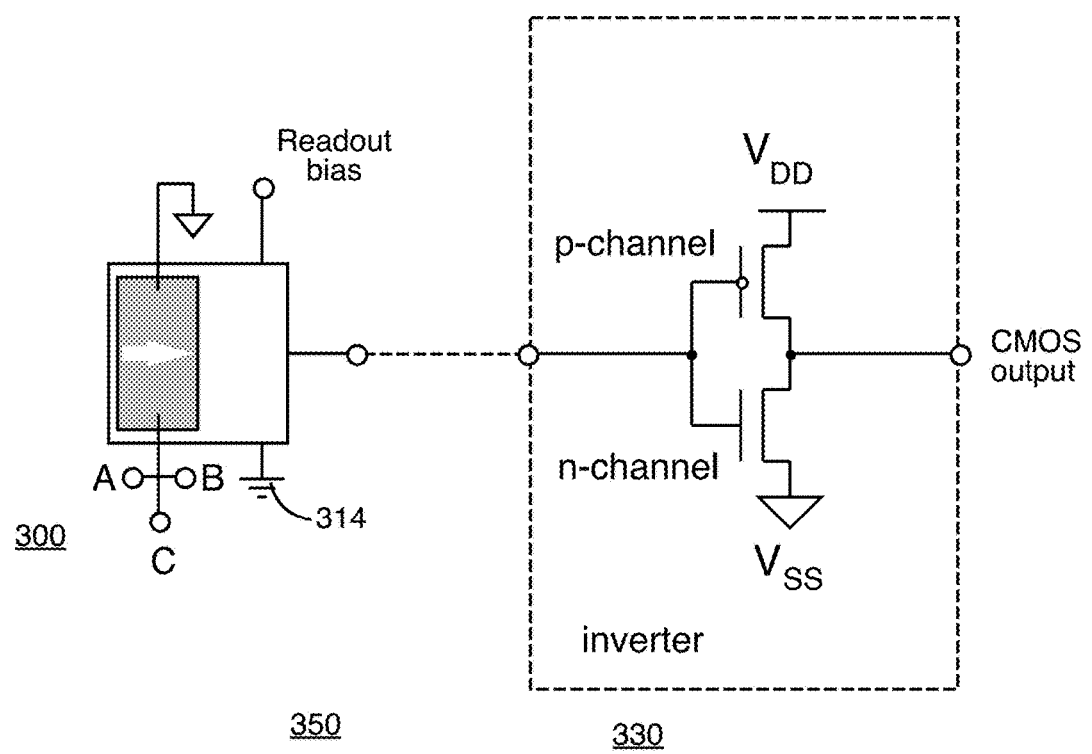
FIG. 3B is an embodiment of a reconfigurable composite logic cell composed of a single improved HHE device, with inverted inputs and a CMOS inverter which performs the functions AND/OR; a noninverting CMOS buffer would perform the functions NAND/NOR.

Application Ser. Nos. 15/250,779, 15/250,784 also showed that the device 300 can be used in a composite cell. As shown in FIG. 3B, the composite cell 350 is composed of a magnetoelectronic device 300 and a simple CMOS inverter 330 (equivalently called a CMOS NOT gate). A requirement of device 300 is that the output levels must have LOW~0 V. The HIGH level must be sufficiently large to exceed the threshold values of the CMOS FETs in the inverter 330. The HHE outputs meet these requirements (for typical FETs) when $2DV_H$~100 mV.

The present disclosure shows that an STT MTJ 200 (FIG. 2A) combined with other circuit elements—namely a few resistors—forms a resistance based cell that behaves in a manner that is analogous with the circuit symbol 300 that appears in FIG. 3A, and this MTJ cell further meets the requirements to be an ALU in the architecture of '656.

Figure 4A:
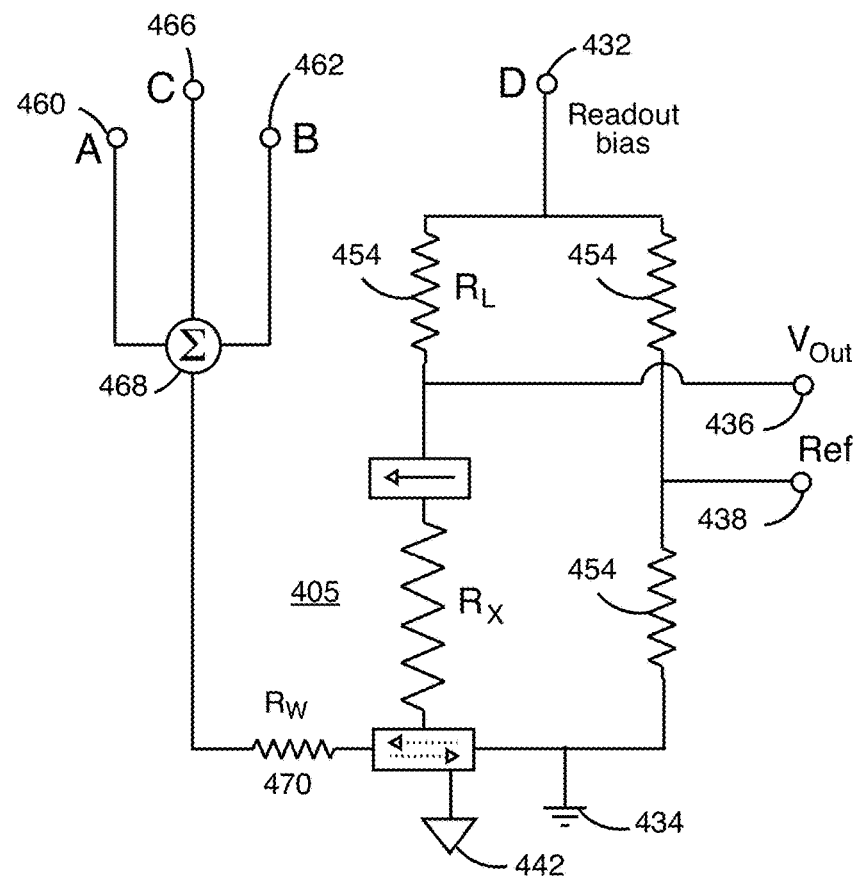
FIG. 4A is a circuit schematic depicting a preferred embodiment of an MTJ based cell with MTJ, STT input, and output levels that are shifted to LOW~0 and HIGH~DV.

To achieve this result, the conventional output voltage levels of an MTJ are preferably shifted. Instead of resistive output levels of $R_L$ (LOW) and $R_L+DR$ (HIGH), the output levels preferably are set to zero (LOW) and $R_H \sim DR$ (HIGH). To achieve this result, a bridge resistor circuit 450 is preferably employed as shown in FIG. 4A. The bridge is preferably a four-arm circuit comprised of four resistors. Three resistors $R_L$ 454 form three arms of the bridge. It will be understood that the resistive elements 454 may themselves take different forms known in the art, and may be arranged in planar or vertical form within an integrated circuit layout. MTJ 405 comprises a fourth arm, with a variable resistance $R_x$ that preferably takes on the values $R_L$ (LOW) and $R_H=R_L+DR$ (HIGH).

A Readout bias voltage $V_{Read}$ is applied between the top and bottom nodes of the bridge (from terminal D 432, typically set to $V_{DD}$, to ground 434). The output voltage of the bridge, $V_{OUT}$, is the voltage at the midpoint between the two resistors in the left arms, and is measured at terminal 436 relative to a voltage at the midpoint between the two resistors in the right arms (Ref) at terminal 438.

From the solution to the equations for an unbalanced Wheatstone bridge (for example: www.grc.nasa.gov/www/k-12/airplane/tunwheat.html), when $R_x=R_L$ voltage $V_{Out}-V_{Ref}=0$. Furthermore, when $R_x=R_H=R_L+DR$, $V_{Out}-V_{Ref}=[(1/2)MR/(2+MR)]V_{Read}$. It is illustrative to calculate a few examples of the high value of $V_{Out}$ which is possible using typical values for MTJ devices. For example when MR=0.5, $V_{Out}=0.1\ V_{Read}$; when MR=1.0, $V_{Out}=0.17\ V_{Read}$; and when MR=1.5, $V_{Out}=0.21\ V_{Read}$. It is common for MTJs in commercial production at this time to have MR values of 1 or higher and it is expected that such figures will increase in the future as well. Values for $V_{DD}$ are 5 V or higher for high performance CMOS, but $V_{DD}$ can be 3 V (or lower) for low power circuits. Even for $V_{DD}=3$ V, the high level of $V_{Out}$ is expected to be 450 mV or higher, a level that readily exceeds the threshold voltage of a typical semiconductor FET. It will be understood by those skilled in the art that the selection of components and values in any particular embodiment will be a function of desired performance parameters and can be determined without undue experimentation.

To complete the description of the ME cell in FIG. 4A, terminals A 460 and B 462 are data inputs and terminal C 466 is a control input, as described in FIG. 2A. If voltage biases are used as inputs, the voltages are summed at node S 468, and converted to an appropriate write current by the value of the sum of resistance $R_W$ 470 and the resistance of the source film (208 in FIG. 2A). If current pulses are used as inputs the currents are summed at node S 468 and $R_W$ 470 has negligible value. Following the description of the STT write process described with FIG. 2A, separate grounds, 442 and 434 (FIG. 4A), are provided for the write and read processes, respectively. Detailed issues of grounding depend on specific applications requirements.

The processing of Boolean operations with this second MTJ ME embodiment is directly analogous with that of the first HHE embodiment described above. Each process begins with a reset pulse. The AND or OR operation begins with the magnetization orientations parallel and the NAND or NOR operation begins with magnetization orientations antiparallel. Unit pulses then are simultaneously applied to terminals A 460, B 462 and C 466. In response to the pulses, the magnetization orientations are either unchanged or reversed, depending on the magnitude of the sum of applied pulses. The result of the operation is stored as the final orientation.

Figure 4B:
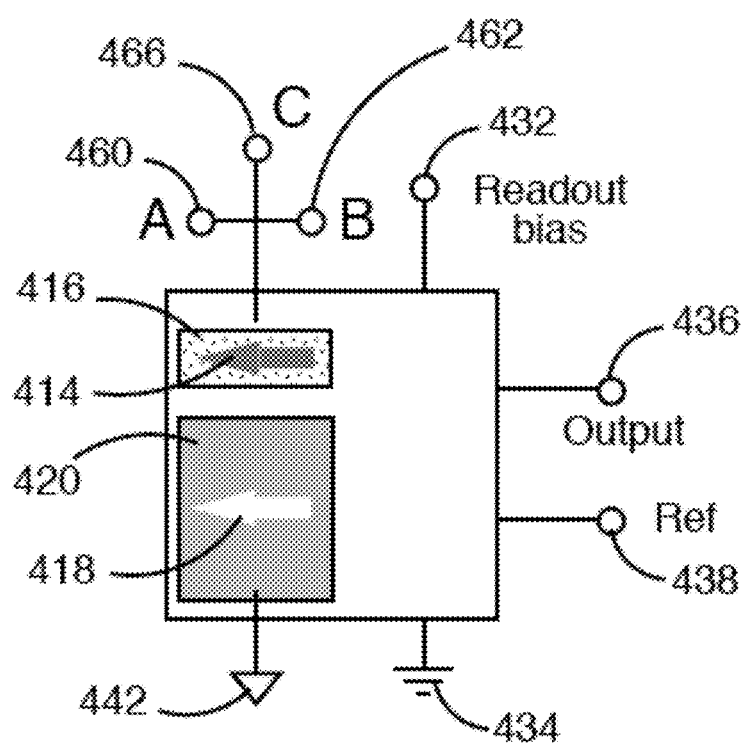
FIG. 4B depicts a circuit symbol that represents the cell of FIG. 4A. This symbol is in direct analogy with the symbol in FIG. 3A, and the operational properties are the same for both cells.

A circuit symbol for the MTJ cell 450, shown in FIG. 4B, is directly analogous with the HHE symbol 300 in FIG. 3A. Two differences between the cells can be noted, but these differences do not affect basic operation.

First, in cell 450 the pinned ferromagnetic layer $F_p$ 416 is shown along with orientation 414. Operation of the cell is determined by control of the magnetization orientation 418 of free layer 420, identically the same as for HHE cell 300.

Second, the reference point for sensing Output 436 is terminal Ref 438 (defined in FIG. 4A). The Output voltage reference in the Hall cell is the ground for the Readout bias. This change makes no difference in the operation of cell 450. Cell 450 is operationally the same as HHE cell 300 and therefore is an appropriate ALU for the nonvolatile logic architecture of '656.

Figure 7:
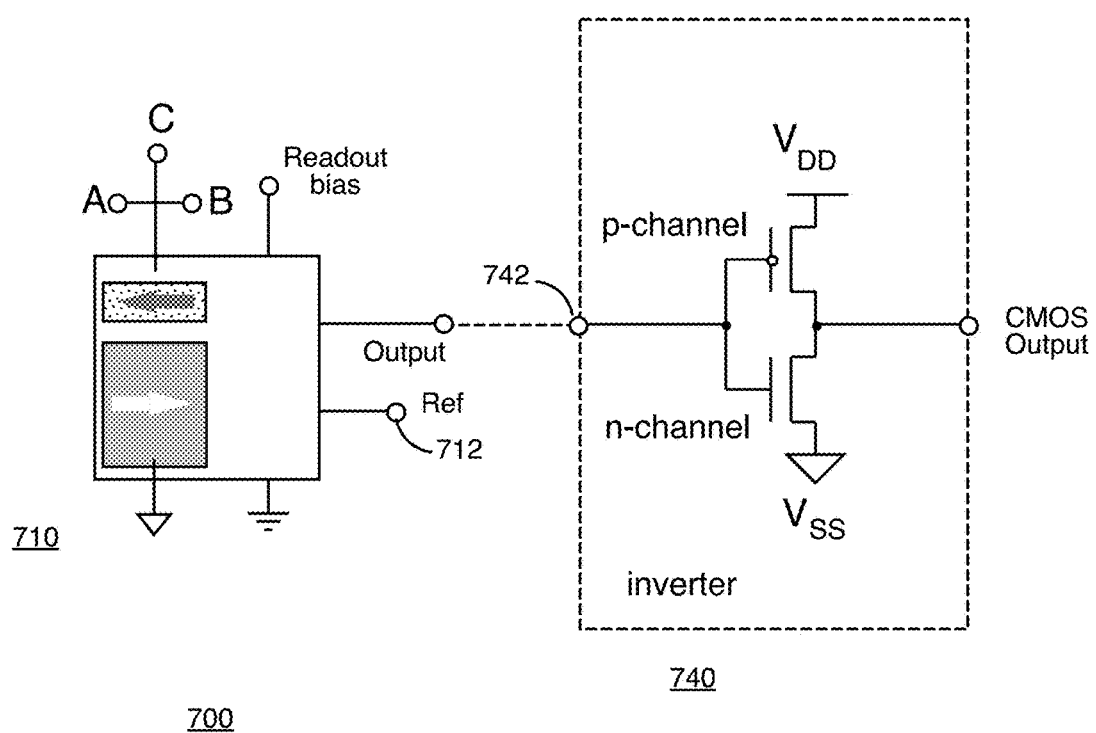
Figure 8:
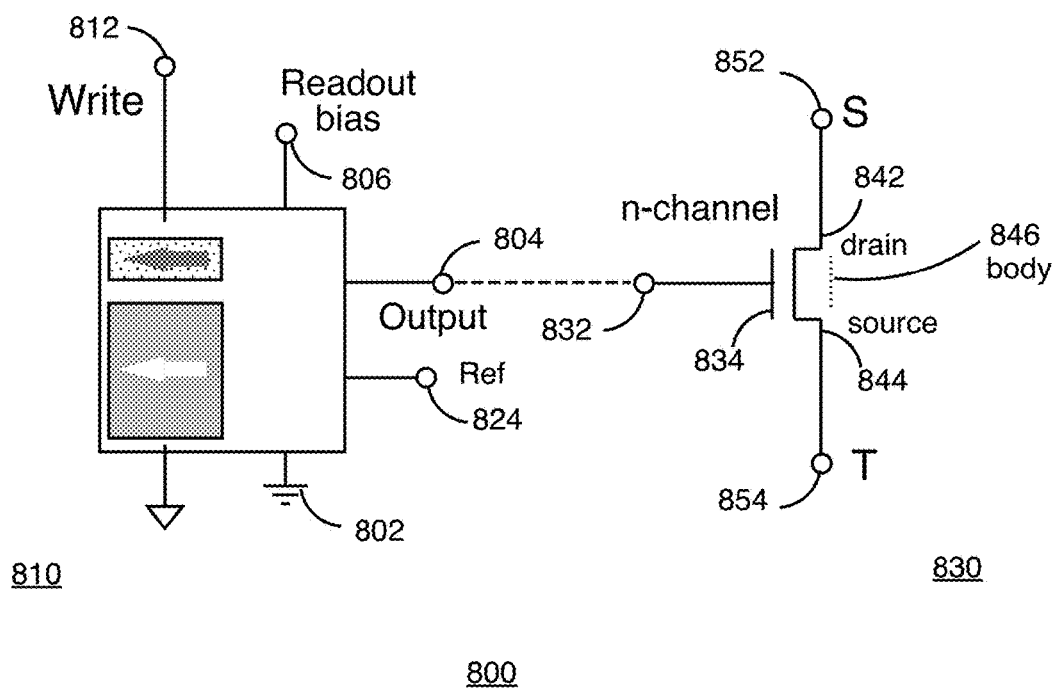
FIG. 8 is a preferred embodiment of a nonvolatile switch composed of a single MTJ cell and a single field effect transistor (FET)

In the discussion of FIGS. 7 and 8 in '838, various benefits for the creation of an inverse HHE device were discussed for the first ME embodiment. Using a cell with both standard and inverted HHE devices permits reconfiguration between the four Boolean operations AND, OR, NAND, NOR and XOR by using one polarity for all reset pulses and the opposite polarity for all input and control pulses.

Figure 4C:
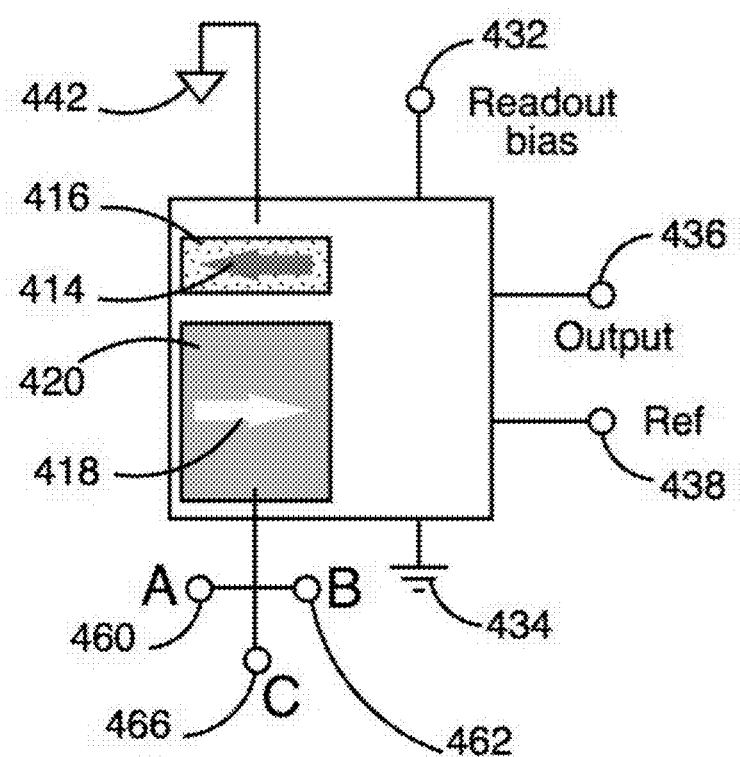
FIG. 4C depicts a circuit symbol that represents the cell of FIG. 4A with inverted inputs.

A comparable inverse device can be created for an MTJ embodiment. FIG. 4C shows a symbol that represents a standard MTJ cell with inverted inputs 480. The orientation 414 of the pinned layer 416 is to the left and the initial orientation 418 of the free layer 420 is to the right. After the initialization by the reset pulse, the MTJ device is in a HIGH resistive state. Positive input pulses may switch the magnetization orientation of the free layer to the left, parallel with that of the pinned layer. In this case, the final state of the device is the LOW resistive state.

Those skilled in the art will recognize that an inverse MTJ cell can be formed using other techniques. For example, such a device may have the pinned layer magnetization set to the right, and have the non-inverted write wire structure of cell 450 in FIG. 4B. This device would then only require conventional known components to provide STT writing to the pinned layer. For the case of the inverted device in FIG. 4C, an external magnetic field can be used to set all the orientations of all the pinned layers (both standard and inverted cells). Such a field could be provided by as a step after chip fabrication and before, or as part of, packaging.

The MTJ cell 450 in FIG. 4B has output levels $V_{Out}$ of LOW~0 V (binary 0) and HIGH~DV, where DV is expected to be 100 to 500 mV, a level that readily exceeds the threshold voltage of a typical semiconductor FET. However, these levels may not be appropriate for integration with all forms of conventional SDE. Furthermore, the high level is not an optimal value for providing input current to subsequent devices (fanout). The output of several hundred mV is applied to a total resistance that is the sum of a 50 Ohm impedance line wire plus the resistance of the STT layers. The total resistance is the order 100 to 1000 Ohms, and the output current available for STT input varies from a few tenths of a mA to several mA. This may be adequate for providing STT current input for a single following ME device. However, it's not sufficiently large to provide fanout to multiple devices. Furthermore, the output levels do not have adequate reproducibility for large scale integration.

For these reasons, a composite resistance based cell that includes a simple CMOS buffer amplifier has advantages. The primary advantage is that the cell output has standard CMOS values $V_{DD}$ and $V_{SS}$. The composite cell has direct analogy with the composite cell described in '838 and the applications referenced above.

Patent '838 showed a reconfigurable composite HHE logic unit comprising 2 HHE cells and a CMOS inverter. The logic unit could be dynamically configured to perform any operation: AND, OR, NAND, NOR, XOR. Application Ser. Nos. 15/250,779, 15/250,784 showed that such a composite logic unit was appropriate for the nonvolatile logic operations described in '656.

Figure 5A:
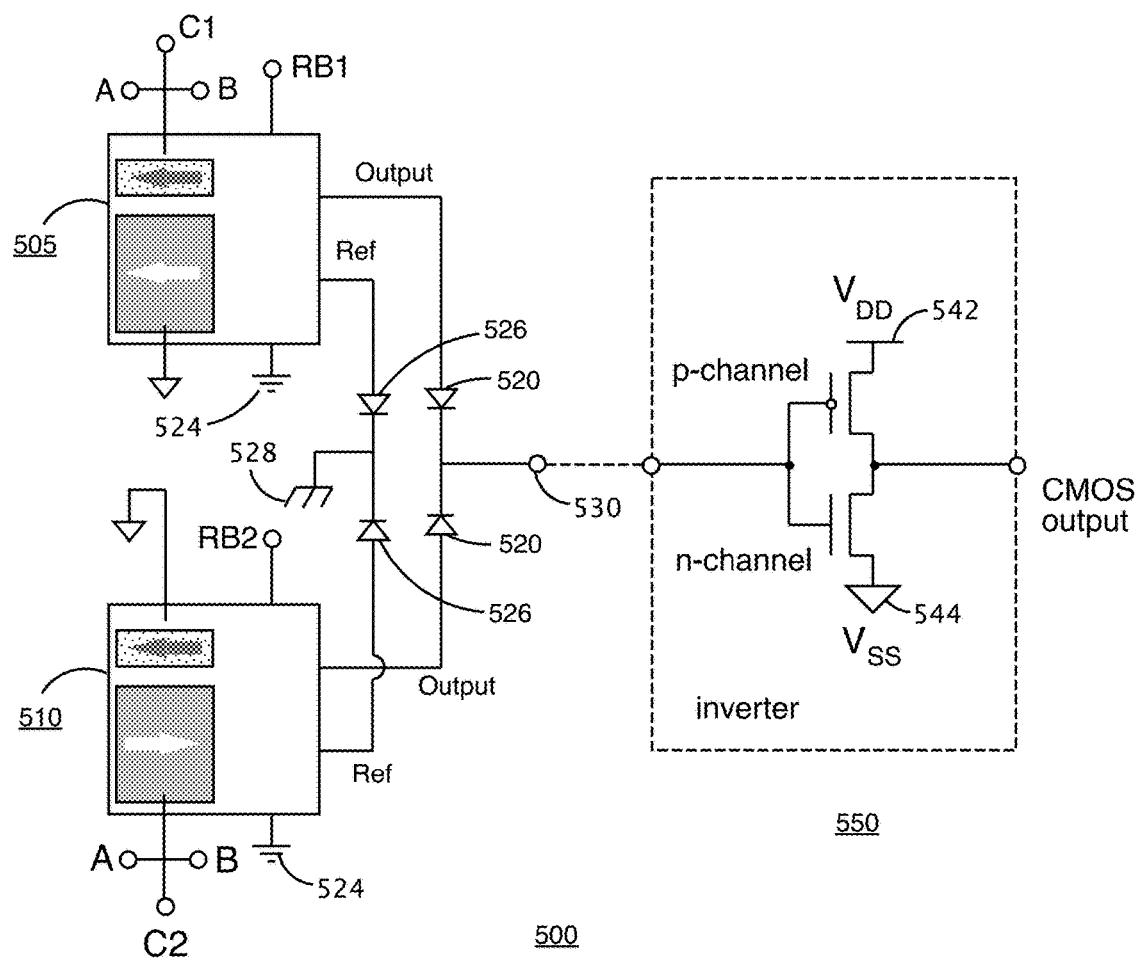
FIG. 5A depicts a preferred embodiment of a reconfigurable composite logic unit composed of two MTJ cells and having a simple CMOS inverter.

FIG. 5A shows an analogous reconfigurable logic cell 500 using MTJ devices 505 and 510. Diodes 520 prevent dissipation of Output voltages from either MTJ through the other MTJ. The reference voltage for the output is preferably taken at a point above the Readout bias ground 524, and diodes 526 are used to prevent dissipation of voltage from one device to the other. Those skilled in the art will appreciate that diodes with the same function as 520 and 526 may be used at other locations in the circuits of devices 505 and 510. The Output voltage at terminal 530 is preferably applied as the gate voltage to the inverter amplifier 550.

The ground of the gate voltage is preferably the reference voltage of the two MTJs. In the figure, this reference voltage has been defined to be independent ground 528. Those skilled in the art will appreciate that other alternatives are possible as well. For example, Output 530 may be treated as a floating voltage and pull-up or pull-down resistors can be included in the circuit.

The reconfigurable cell in FIG. 5A can perform any of the five basic Boolean functions, AND, OR, NAND, NOR and XOR, as explained in the truth table shown in FIG. 5B. A reconfigurable cell comprising devices 505 and 510 and a noninverting buffer amplifier can perform any of the five basic Boolean functions, AND, OR, NAND, NOR and XNOR, as explained in the truth table shown in FIG. 5C. Each of these cells is a suitable ALU for the architecture in FIG. 1, demonstrating that the nonvolatile architecture of '656 can be implemented using magnetic tunnel junctions in the form disclosed herein.

Analogous with '838 this type of resistance based logic unit (e.g. 500 in FIG. 5A) can be implemented as a logical functional building block for higher level processing devices, such as microprocessors, digital signal processors, RISC processors, programmable logic, etc. The expression "logic" device, therefore, as used herein is intended in its broadest connotation and intended to include such logical operations, numeric operations, etc. For purposes of simplifying and understanding the more important aspects of the present invention, certain less essential features of the device (such as the grounds for the write wires and for the device itself, the layout of the write layer and read terminal, etc.) are omitted from further discussion herein. It will be understood also that specific implementations of the inventive devices will vary from application to application.

It can be seen that the reconfigurable logic cell 500 in FIG. 5A can operate as the ALU in a nonvolatile logic circuit such as described in the aforementioned '656 patent embodiments. As noted above, FIG. 1 represents a generic description of a reconfigurable logic cell 100 used as an ALU. As further explained, this cell includes a separate nonvolatile memory element 122 that provides voltage readout as an alternative to current readout.

The operation of the cell involves 4 steps. As presented in '656, and as with the case of the MFCAD ALU the operational steps are as follows:

1) Transmitting a functional control or configuration pulse to terminal C 102: this sets the magnetization of the "Control" F element and thereby controls the function of the device, for example to perform one of several possible Boolean operations. Examples are AND/OR; NAND/NOR etc. In this nomenclature, the abbreviation "A?B" represents a chosen operation.

2) Transmitting input operand or data pulses to input terminal A 104 and input terminal B 106: these pulses set magnetization states of two F elements that provide local fields to the MFCADs. The configuration of orientations determine the output of the gate.

3) Transmitting a current read pulse to bias terminal D 108: this applies a voltage pulse across the diode channel and results in a current that depends on the resistance of the channel so that it can be associated with two different distinguishable current conditions, where a first current is larger than a second current for example. This current in turn, depends on input fields that result from inputs A and B. This "readout" of the results can be done at any time after step (2) and provides a current output. This current also is sent as an input to a magnetic storage element 122, such as an MTJ or a separate magnetic field controlled avalanche diode (MFCAD), in the same cell. Again as alluded to previously, pulses to terminals C, A, B and D may share a common ground 116. The output current may be sensed by an ammeter between terminal 108 and ground 116. Alternatively, the output current may be made available at a separate terminal 112.

4) Transmitting a voltage read pulse to bias terminal E 110: this applies a voltage pulse to the nonvolatile magnetic storage element 122 and the output 112 indicates the stored value. Depending on the type of magnetoelectronic device used, the output could be a high or low voltage (using an MTJ) or a high or low current (using an MFCAD). A voltage readout may be convenient for transmission to an output port, or as a voltage bias to another device. Those skilled in the art will note that in the first 2 steps, the input pulse is configured as a current pulse but other circuit considerations may allow the pulse to be defined as a voltage pulse as well.

Cell 500 in FIG. 5A operates with the same basic read/write operational steps used above to describe the operation of cell 100 in FIG. 1. In one embodiment, this cell also includes a separate nonvolatile memory element 580 (not shown).

Figure 6:
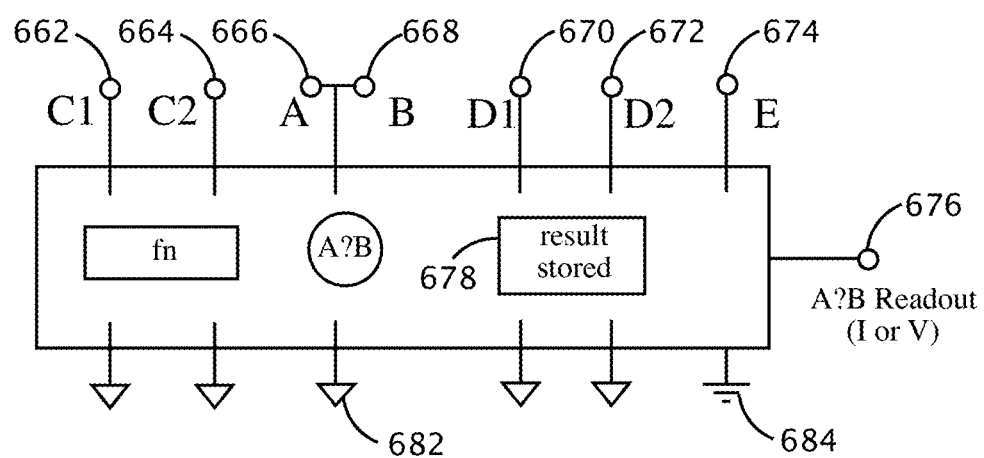
FIG. 6 is a schematic diagram of a preferred embodiment of a reconfigurable non-volatile logic unit implemented in accordance with the present teachings for composite MTJ cell, and which is suitable for use in the nonvolatile logic architecture of '656.

The reconfigurable logic unit 500 can be used in an ALU that performs in the same way as ALU 100 in FIG. 1. This ALU 650 is shown in FIG. 6. Following the description of FIG. 5A, the output levels of 550 and therefore of ALU 650 are preferably CMOS HIGH and LOW levels, $V_{DD}$ and $V_{SS}$. These voltage levels can be converted to currents, if needed for input to a subsequent ME cell. Depending on particulars and requirements of the circuit, the current can be determined by a resistor in a wire that's part of a subsequent stage of the circuit. Alternatively, ALU 650 can have two output terminals separated by a switch (not shown). As another alternative, a separate nonvolatile memory element 678, directly analogous with memory element 122 in FIG. 1, can be added to the unit. One output terminal delivers the output in the form of different voltage levels. The other terminal includes a resistor that determines the outputs as different current levels. In this embodiment, a pulse to terminal E 674 sets the switch to select one of the two output terminals to be output at terminal 676.

The operation of resistive cell 650 now can be compared to the operation of cell 100 in FIG. 1:

1) A reset pulse to terminal C1 initializes the magnetization orientation of the free ferromagnetic film of device 505 (FIG. 5A) to point left. A reset pulse to terminal C2 initializes the magnetization orientation of the free ferromagnetic film of device 510 (FIG. 5A) to point right.

2) Control/configuration and input pulses are applied simultaneously. Separate control configuration pulses are sent to terminals C1 662 and C2 664 in accordance with a desired operation to be performed (FIG. 5B). Data input pulses are sent to terminal A 666 and B 668 for the operands. The A and B input pulses are applied to both devices 505 and 510. The abbreviation "A?B" represents the chosen operation. Again, referring to FIG. 5B, the operation can be configured to be AND, OR, NAND, NOR or XOR. Application of these pulses sets the magnetization states of the two respective F films in devices 505 and 510, according to the chosen Boolean process. The output of gate 650 is now determined based on the combination of configuration and data input signals.

3) Transmit a pulse to bias terminal E 674 to set the output 676 to be a current. As discussed with cell 100 in FIG. 1, it may be desirable to transmit the bias pulse at terminal E to a ground 684 that is separate from other grounds 682 used in unit 650.

4) Transmit four simultaneous pulses: RB1 to terminal D1 670, RB2 to D2 672, a pulse $V_{DD}$ applied to 542 (FIG. 5A), and a pulse $V_{SS}$ applied to 544 (FIG. 5A). The output of the chosen operation will be a current pulse at terminal 676, with LOW amplitude $I_{OUT}=V_{SS}/R_W \sim 0$ (binary 0) or HIGH amplitude $I_{OUT}=V_{DD}/R_W$ (binary 1). This Readout process can occur at any time after step (2).

5) Transmit a pulse to bias terminal E 674 to set output 676 to be a voltage.

6). Repeat Step (4). The output of the chosen operation will be a voltage pulse at terminal 676, with LOW amplitude $V_{OUT}=V_{SS} \sim 0$ (binary 0) or HIGH amplitude $V_{OUT}=V_{DD}$ (binary 1).

Using these steps, the nonvolatile logic architecture of '656 can be implemented using the new reconfigurable composite resistance based MTJ ALU 650 (FIG. 6). This embodiment has significant advantages as explained below. First, the output levels are highly reproducible and have larger magnitude than MCFCADs or ME devices that lack buffered output. Furthermore, the device can be reconfigured among four functional choices rather than two. As another significant advantage, MTJs are in commercial production using CMOS production lines. They are readily integrated with CMOS buffers and other semiconductor information processing circuits.

There may be applications for which reconfiguration between only 2 operations, such as AND/OR; NAND/NOR, is required. In these applications there may be advantages to minimizing the number of devices in the ALU. FIG. 7 shows a reconfigurable cell 700 composed preferably of a single MTJ cell (with bridge circuit) 710 and a buffered output amplifier 740. The embodiment shown in FIG. 7 uses a noninverted MTJ cell and an inverting buffer amplifier, and can reconfigure to provide NAND or NOR functions. It will be realized that other combinations may be used according to the specific needs of the application. For example, an inverting MTJ cell with inverting buffer amplifier can reconfigure to provide AND or OR functions. As discussed previously, the Output of the MTJ cell preferably is applied (at terminal 742) to both gates of the FETs in the inverter cell 740, and the gate voltage ground preferably uses the Reference terminal 712. Other grounding configurations can be used. For example, the Output voltage can be treated as a floating voltage and a pull-up or pull-down resistor can be used.

Those skilled in the art will appreciate that minor modifications to logic unit 700 can add functionality. In another embodiment, an additional inverter 750 (not shown) would follow inverter 740 with a switch (not shown) between the two. An additional control pulse C2 to the switch is used as well. For two functions (e.g. AND, OR), C2 sets the switch to be open and the output is read at 740. For inverse functions (NAND, NOR) C2 sets the switch to be closed and readout is at an output (not shown) of the second inverter. Other implementations will be apparent to those skilled in the art.

Those skilled in the art will recognize that each ME cell circuit may have advantages in different circuits and applications. The present disclosure shows that such cells are also appropriate reconfigurable logic units for the ALU shown in FIG. 1. Therefore, the nonvolatile logic architecture described in '656 can be implemented using these cells.

As another aspect of the present invention, the nonvolatile logic architecture presented in '656 further uses numerous nonvolatile switches in the sub-circuits and circuits. A nonvolatile switch 800 can be made using the MTJ cells described herein along with a single semiconductor FET. One embodiment, shown in FIG. 8, is comprised of an MTJ device 810 and an enhancement mode FET 830.

The MTJ Output 804 is preferably provided to terminal 832 and therefore to gate 834 of an n-channel enhancement mode FET 830. The Output voltage, with HIGH value typically of DV, is defined relative to a read Reference 824. This same Reference can be attached to the source 844, drain 842 or body 846 of the FET 830. Alternative methods for referencing the gate voltage are known in the art. The operation of MTJ 810 is directly analogous with that of an MTJ memory device (refer also to the MTJ logic unit in FIG. 4B). The logical state is determined using an STT write process and write pulses applied to terminal 812. A Reset pulse sets the initial magnetization orientation of the free layer to be parallel with that of the pinned layer. Next, a write pulse is applied. A zero amplitude write pulse (binary 0) leaves the magnetization orientations of the pinned and free layers parallel and the MTJ is in the LOW resistance state. A unit amplitude write pulse (binary 1) changes the orientation of the free layer wo be antiparallel with that of the pinned layer and the MTJ is in the HIGH resistance state.

When MTJ 810 is in a logical LOW state (binary 0), Output=0 V, the n-channel FET is not conducting, and there is open circuit between terminals S 852 and T 854. When MTJ 810 is in a logical HIGH state (binary 1), the voltage at 804 is Output=+DV. The magnitude of DV can be several hundred mV, sufficient to exceed the threshold voltage of an appropriately chosen FET. The n-channel FET 830 then becomes conductive, resulting in a low resistance connection between terminals S 852 and T 854. Following this description, the circuit of FIG. 8 operates as a nonvolatile switch. The state of the switch (open or closed) therefore is determined by the nonvolatile state of MTJ device 810. The switch becomes actively open (high impedance) or closed (low impedance) in response to and whenever bias is applied to readout terminal 806 and ground 802 of MTJ device 810. Other embodiments of the NV switch will be apparent to skilled artisans based on the teachings of the present disclosure.

Figure 9A:
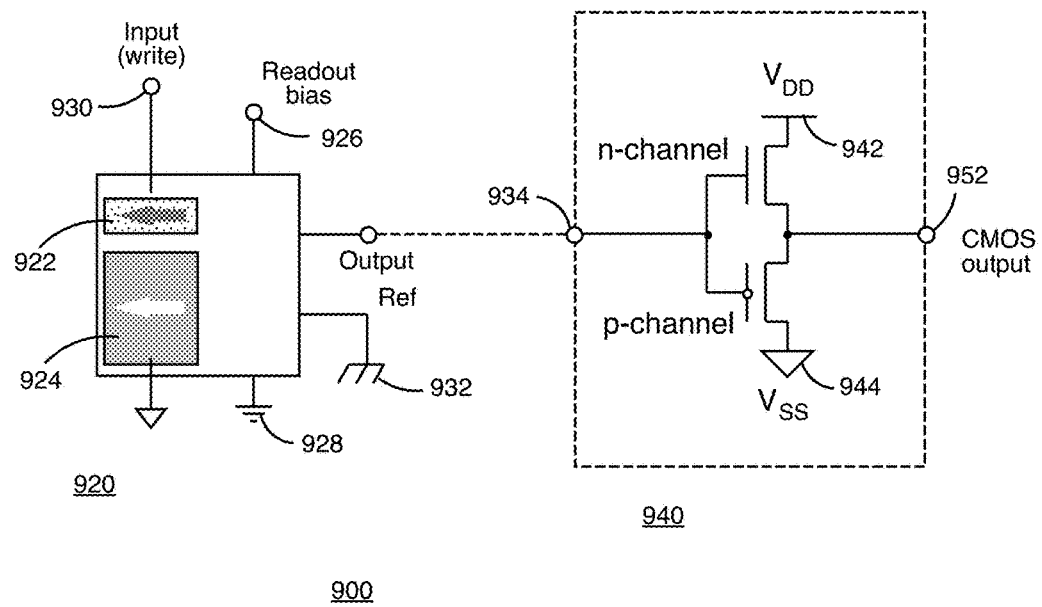
FIG. 9A is a preferred embodiment of a composite nonvolatile memory cell composed of a single MTJ cell and a CMOS buffer amplifier.

FIG. 9A shows yet another embodiment of the invention, in which a composite memory cell 900 is composed of a magnetic tunnel junction (in a bridge circuit) 920 and two FETs in a buffer amplifier 940. In this configuration, composite unit 900 operates as a self contained nonvolatile memory cell. The process of storing data (in this case a single bit) takes two steps. In the first step, a Reset current pulse is applied to Input 930. As discussed in a prior section in this specification, the Reset may be a voltage pulse, in which case a resistor is chosen to have a value $R_W$ in the following way. The sum $R_{tot}$ of $R_W$ plus the resistance of the source film is such that the reset voltage applied across $R_{tot}$ results in a current amplitude 6 that is sufficient to set the magnetization orientation of the free film $F_f$ 924. If the input is a current pulse, no series resistor is needed.

In the second step, an input write pulse is applied to Input terminal 930. For logical/binary 0, the amplitude of the input pulse is preferably selected to be zero, for either voltage or current inputs. For logical/binary 1, an input current pulse preferably is chosen to have amplitude $I_W$, sufficient to switch a magnetization orientation of free film $F_f$ 924. An input data voltage pulse is set to have the same amplitude as a Reset voltage pulse but opposite polarity. The binary value is stored in a nonvolatile way in the form of the final resulting orientation of free film 924, either parallel (binary 0) or antiparallel (binary 1) with the orientation of pinned film 922.

Readout of the stored value is performed at any desired later time. A Readout bias pulse (typically from a voltage source such as $V_{DD}$) is applied from Readout bias terminal 926 to ground 928, resulting in a LOW (approximately 0) or HIGH (order of 100 mV) voltage that is applied to terminal 934 and therefore to the gates of the FETs in buffer 940. Synchronous pulses of supply voltage $V_{DD}$ 942 and $V_{SS}$ 944 are applied to the n-channel and p-channel FETs, and CMOS level voltage pulses $V_{SS}$ (LOW, binary 0) or $V_{DD}$ (HIGH, binary 1) are produced at the output 952. Pulse duration is not critical, although the external circuit may impose other conditions.

It will be clear to those skilled in the art that other variations of cells 900, 920 and 940 may be used to advantage, according to specific demands of a circuit. Examples include using an inverted MTJ cell. Another example is the use of an inverting buffer amplifier for 940. It is also clear that a separate Reset input terminal may show advantage in some circuits. The requirements of an application may result in one embodiment being preferred over another.

Figure 9B:
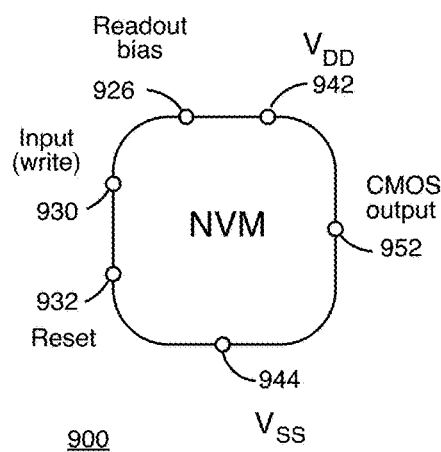
FIG. 9B depicts a circuit symbol that represents the nonvolatile memory cell in FIG. 8A.

A circuit symbol for a novolatile memory (NVM) cell 900 is shown in FIG. 9B. There may conditions for which a preferred embodiment includes a separate input terminal 932 for the reset pulse. More generally, the reset pulse may be applied at an input terminal 930.

As noted earlier, the nonvolatile logic architecture presented in '656 also employs several nonvolatile memory cells (NV memory). For example, such a cell is used as a test register at the output stage of the ALU, and such cells are used as data registers at the data input/output ports. The nonvolatile memory cell (NVM) described with FIGS. 9A and 9B is an appropriate memory cell for use in the '656 architecture where it can be integrated with other ME devices of like materials, functionality and peripheral (I/O signal generation) requirements.

As another aspect of the present invention, self-contained nonvolatile memory cell 900 can be used with advantage in simple traditional semiconductor technology (such as CMOS) sub-circuits and circuits. It is known in prior art that a 2-dimensional memory nonvolatile magnetic random access (MRAM) array can be can be added to a semiconductor digital information processing chip. The nonvolatile memory has an array of memory cells, along with CMOS circuits for the address architecture and for sense amplifiers distributed at the ends of bit lines or word lines. Data values from logic processing operations can be transmitted to the array and stored in a nonvolatile way. At any later time, values in the array can be chosen by their address and read back into the operating memory of the logic processing sectors.

Figure 10:
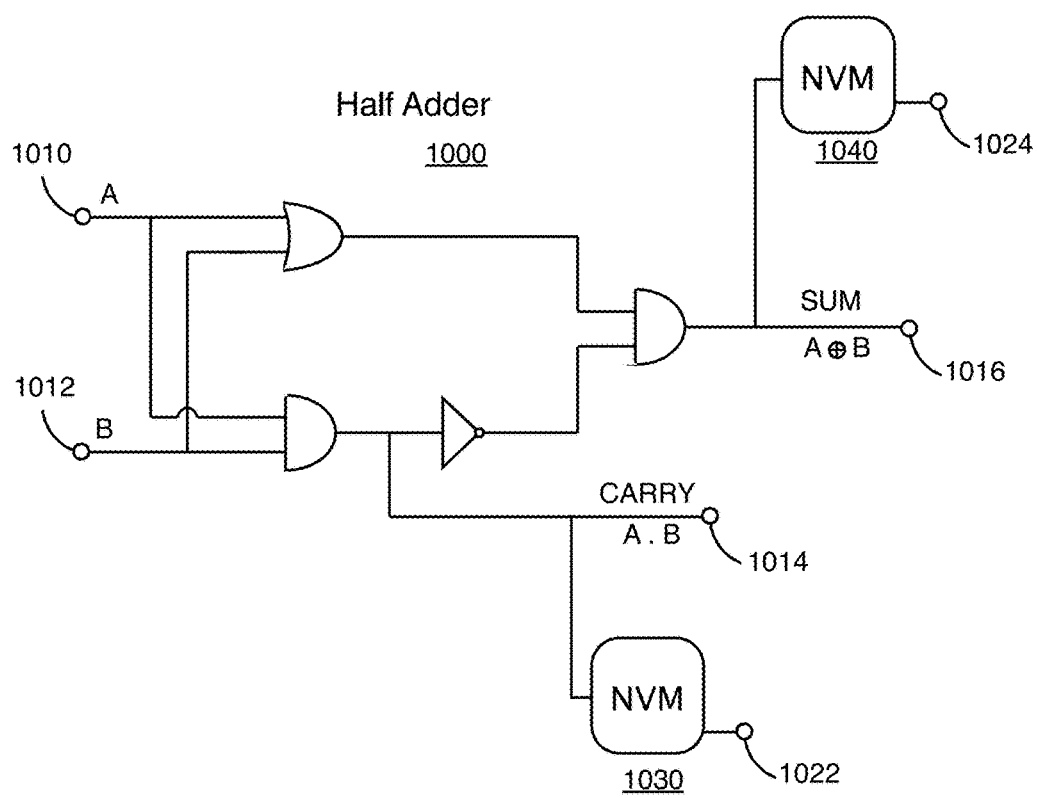
FIG. 10 is an embodiment of an improved semiconductor logic circuit, a half adder, which includes 2 nonvolatile memory cells of the type shown in FIG. 9A.

However, there may be applications for which nonvolatile storage of a single datum, or of a relatively small number of data values, is needed. Such applications may be found in microprocessors or nanoprocessors, a variety of reconfigurable logic circuits, as well as larger information processing platforms. The self-contained storage cell 900 can be used to advantage. One cell, or a few cells, can be fabricated where needed, with no need for fabrication of a 2-dimensional array with its associated support circuits. A simple embodiment of a magnetoelectronic/semiconductor adder circuit is shown in FIG. 10. This figure schematically shows a Half Adder sub-circuit 1000 using a combination of CMOS AND, OR and NOT gates. The Half Adder 1000 is driven by a conventional clock circuit (not shown). Synchronized input pulses are applied at terminals A 1010 and B 1012. The output is a SUM bit (0 or 1) and a CARRY bit (0 or 1) that appear synchronously at terminals 1016 and 1014, respectively.

In normal operation, the output values are passed to inputs of other logic sub-circuits. Alternatively, the values may be sent to a temporary memory register that stores the values until they are needed, typically a few clock cycles later.

There may be occasions when the SUM and CARRY bits are not needed until a later time, that is, for thousands or millions of clock cycles. There may be other occasions when the output bits are needed at a much later time (seconds, hours or even longer). Nonvolatile memory cells 1030 and 1040 can be added to the Half Adder circuit, as shown in FIG. 10, to provide nonvolatile storage of the SUM and CARRY bit values. The Half Adder 1000 can be powered down until it is needed again. The values of the SUM and CARRY bits can be provided to another sector of the circuit, in the form of CMOS pulses, by applying voltage pulses to cells 1030 and 1040 in the manner described above.

During operation of the Half Adder cell 1000, reset pulses are sent to the two cells 1030 and 1040 during a first clock pulse. The next clock pulse applies simultaneous input pulses to A 1010 and B 1012. When output CARRY pulse reaches 1014, that pulse is also applied as input to NVM 1030 and simultaneous supply pulses are applied to NVM 1030. When the output SUM pulse reaches 1016, that pulse is also applied as input to NVM 1040 and simultaneous supply pulses are applied to NVM 1040. At any later time, the stored SUM and CARRY values are available at 1024 and 1022, respectively, and are supplied to subsequent circuits by applying Readout bias and supply ($V_{DD}$ and $V_{SS}$) pulses to these two NVM cells.

While this is a relatively simple example using a low level sub-circuit, NVM cells can be added to other types of CMOS sub-circuits and circuits of greater complexity. At a higher level, NVM cells can be added to a sector of circuits in a processing chip, to store any desired number of data values that result from ongoing computations. This can be valuable if other portions of the chip are not ready to receive these values. The computing sector that generated the data can be powered down until it is needed again. The values that resulted from the computation of that sector are available to other portions of the chip at any time.

The examples above are merely illustrative of the general principles inherent in the teaching of the present invention. Other variations will be apparent to skilled artisans, and the present invention is by no means restricted to such embodiments and examples.

What is claimed is:

1. A reconfigurable processing system implemented with magnetoelectronic devices and situated on a single semiconductor chip, comprising:
  a first memory circuit that includes a first plurality of magnetic tunnel junction (MTJ) devices of a first type adapted to store program data and operations data;
  a second processing circuit that includes one or more second MTJ device(s) of a second type adapted to perform a first set of operations during an operational mode in accordance with a first program stored in said first memory circuit;
  wherein each of said first plurality of MTJ devices and said one or more second MTJ device(s) are magnetoelectronic devices that include:
    i) a first ferromagnetic film having a configurable magnetization orientation;
    ii) a second ferromagnetic film having a fixed magnetization orientation;
    iii) a barrier film situated between said first ferromagnetic film and second ferromagnetic film;
  wherein the magnetoelectronic devices are configured to conduct and impart a spin-torque transfer current to set a state for said configurable magnetization orientation in said first ferromagnetic film;
    iv) a voltage shifting circuit for adjusting an output level of the MTJ device to be compatible with a logic level input required by a semiconductor FET;
  further wherein said first plurality of MTJ devices and said one or more second MTJ device(s) are passive devices that consume substantially zero quiescent power in a non-operational mode.

2. The reconfigurable processing system of claim 1 further including a write ferromagnetic film adjacent said first ferromagnetic film and adapted to conduct a spin torque transfer current to said MTJ device.

3. The reconfigurable processing system of claim 1 wherein the MTJ device and voltage shifting circuit are arranged in a Wheatstone bridge configuration.

4. The reconfigurable processing system of claim 1 wherein said first ferromagnetic film and said second ferromagnetic film have in-plane magnetization orientations.

5. The reconfigurable processing system of claim 1 wherein said first ferromagnetic film and said second ferromagnetic film have perpendicular to-plane magnetization orientations.

6. A non-volatile switch implemented with a magnetoelectronic device comprising:
  a first non-volatile memory circuit that includes a first magnetic tunnel junction (MTJ) device having a first input and a first output;
  a second semiconductor FET configured as a switch and having a gate signal provided by said first output from said first memory circuit;
  wherein the MTJ device further comprises:
    i) a first ferromagnetic film having a configurable magnetization orientation;
    ii) a second ferromagnetic film having a fixed magnetization orientation;
    iii) a barrier film situated between said first ferromagnetic film and second ferromagnetic film;
  wherein the MTJ device is configured to conduct and impart a spin-torque transfer current to set a state for said configurable magnetization orientation in said first ferromagnetic film;
    iv) a voltage shifting circuit for adjusting an output level of the MTJ device to be compatible with a logic level input required by said second semiconductor FET(.);
  further wherein an input signal to said first input of said first MTJ determines a stored non-volatile state that is useable for controlling said switch.

7. The non-volatile switch of claim 6 further including a write ferromagnetic film adjacent said first ferromagnetic film and adapted to conduct a spin torque transfer current to said MTJ device.

8. The non-volatile switch of claim 6 wherein the MTJ device is situated in a first portion of an integrated circuit and configured as part of a semiconductor logic circuit in said first portion of said integrated circuit.

9. The non-volatile switch of claim 6 wherein the MTJ device configured as a standalone single bit device and not as part of a memory array.

10. A non-volatile resistive memory cell implemented with a magnetoelectronic device comprising:
  a first magnetic tunnel junction (MTJ) device which includes a first input and a first nominal output;
  a voltage shifting circuit coupled to said MTJ device adapted to shift a level of said first nominal output and convert it to a range suitable for a subsequent semiconductor based circuit stage;
  further wherein an input signal to said first input of said first MTJ device determines a non-volatile data value stored in the memory cell.

11. The non-volatile resistive memory cell of claim 10 further including a write ferromagnetic film adjacent said MTJ device and adapted to conduct a spin torque transfer current representing said input signal to said MTJ device.

* * * * *